United States Patent
Hicks et al.

(10) Patent No.: US 10,165,203 B2
(45) Date of Patent: Dec. 25, 2018

(54) PER-PIXEL PERFORMANCE IMPROVEMENT FOR COMBINED VISIBLE AND INFRARED IMAGE SENSOR ARRAYS

(71) Applicant: Intel Corporation, Santa Clara, CA (US)

(72) Inventors: Richmond Hicks, Beaverton, OR (US); Khaled Ahmed, Anaheim, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/000,726

(22) Filed: Jun. 5, 2018

(65) Prior Publication Data

US 2018/0288342 A1    Oct. 4, 2018

Related U.S. Application Data

(62) Division of application No. 15/184,293, filed on Jun. 16, 2016, now Pat. No. 9,992,430.

(51) Int. Cl.
| | |
|---|---|
| H01L 21/00 | (2006.01) |
| H04N 5/33 | (2006.01) |
| H01L 27/146 | (2006.01) |
| H04N 9/04 | (2006.01) |
| H04N 5/374 | (2011.01) |

(52) U.S. Cl.
CPC ....... *H04N 5/332* (2013.01); *H01L 27/14621* (2013.01); *H01L 27/14685* (2013.01); *H04N 5/374* (2013.01); *H04N 9/045* (2013.01)

(58) Field of Classification Search
None
See application file for complete search history.

(56) References Cited

U.S. PATENT DOCUMENTS

| | | | |
|---|---|---|---|
| 7,247,851 B2 * | 7/2007 | Okada | H01L 27/14645 250/208.1 |
| 2017/0054924 A1 * | 2/2017 | Chuang | H04N 5/332 |
| 2017/0237911 A1 * | 8/2017 | Won | H01L 27/14623 348/164 |

\* cited by examiner

*Primary Examiner* — Angel Roman
(74) *Attorney, Agent, or Firm* — Womble Bond Dickinson (US) LLP

(57) ABSTRACT

A per-pixel performance improvement is described for combined image sensor arrays that measure infrared and visible light. One embodiment is a method that includes forming an array of photodetectors on a silicon substrate, treating a subset of the photodetectors to improve sensitivity to infrared light, and finishing the photodetector array to form an image sensor.

11 Claims, 4 Drawing Sheets

PER-PIXEL PERFORMANCE IMPROVEMENT FOR COMBINED VISIBLE AND INFRARED IMAGE SENSOR ARRAYS

RELATED APPLICATION

The present application is a divisional of and claims the benefit of U.S. patent application Ser. No. 15/184,293, filed on Jun. 16, 2016 and entitled "PER-PIXEL PERFORMANCE IMPROVEMENT FOR COMBINED VISIBLE AND INFRARED IMAGE SENSOR ARRAYS", and is incorporated by reference in its entirety.

FIELD

The present description relates to the field of image sensors for near infrared and, in particular, to an image sensor with pixels that are configured for particular optical bands.

BACKGROUND

Small image sensors continue to improve in cost and performance and have become ubiquitous in smart phones, notebook computers, tablets and many other devices. At the same new device types such as headsets, glasses, dashboard cameras, and autonomous vehicles continue to emerge. The common CMOS (Complementary Metal Oxide Semiconductor) image sensor that is used in most digital cameras has an array of photodetectors. Usually there is one photodetector for each pixel. The sensor is well suited to capture and measure visible light.

The same sensor is also able to capture and measure NIR (Near Infrared) light. As a result, new applications are being developed to exploit this property. Biometric authentication and depth cameras, for example have been developed to use NIR. NIR has a benefit of revealing features that are not visible in visible light. Such features may reflect NIR but not visible light or the system may incorporate invisible, NIR illumination that does not distract or otherwise influence the user.

Imaging applications extending the range of spectral sensitivity beyond the visible range are coming to market. These applications include face recognition, iris scanning, and multi-spectral imaging for analyzing chemical content to name a few examples.

BRIEF DESCRIPTION OF THE DRAWING FIGURES

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity.

DETAILED DESCRIPTION

The proposed solution optimizes the bandgap of the silicon material on a per pixel basis, enabling optimization of the Quantum Efficiency (QE) and detector leakage based on the wavelength being detected at each pixel. This allows visible and infrared light performance to be enhanced on a single sensor or an image array. Such sensors are useful not only for biometric identification but also for lighting control and materials scanning, such as checking food.

CMOS image sensors provide good performance for visible light and also for infrared light. They have a common underlying photodetector element that is optimized for the visible spectrum due to the large focus in the marketplace on visible light photography. This leads to a lower performance in the near infrared (NIR) wavelengths which are considered less important in the marketplace. As described herein, each pixel may be configured to provide high performance for its intended purpose without affecting the other pixels.

The most common material used to build photodetectors for imaging applications is silicon. The spectral absorption of silicon at longer wavelengths is reduced due to the band-gap of silicon which is about 1.14 eV. As photons approach this energy level, the probability of absorption for a given penetration depth decreases and for photons below this energy level, silicon is transparent. Photons travel right through the silicon and energy cannot be absorbed and detected.

Figure 1:
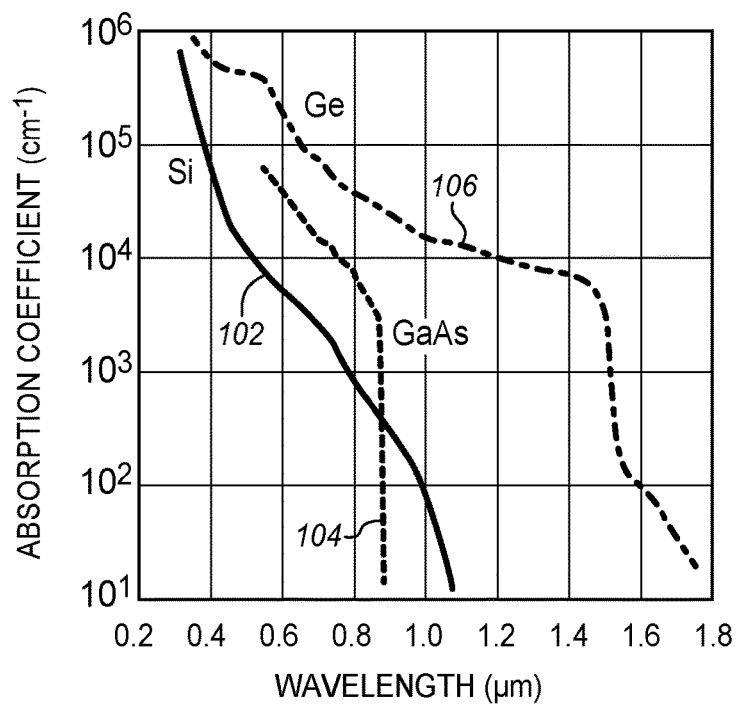
FIG. 1 is a graph of photon absorption of various materials.

Other materials are used for optical applications and may be used for image sensors such as germanium and gallium arsenide. FIG. 1 is a graph of the absorption coefficient on the vertical axis for different light wavelengths on the horizontal axis for three materials. The curve 102 for silicon shows a very steep drop in absorption as the wavelength increases. At about a 1.1 µm wavelength there is almost no absorption. A curve 104 for GaAs shows a much higher absorption coefficient up to about 0.85 µm in the wavelength of incident light. For longer wavelengths there is almost no absorption. A curve 106 for germanium has higher absorption at wavelengths longer than about 0.4 µm and up to 1.5 µm after which the absorption drops almost immediately. Germanium is naturally a better material for an infrared photodetector.

While these other materials provide higher sensitivity to infrared light than silicon they are also more expensive, more difficult to turn into photodetectors, and less suited to fabricating logic circuits. In addition, decreasing the band gap by using a more responsive material also increases the probability of thermal energy causing an electron to jump across the gap. This may cause higher leakage between pixels, and therefore higher noise. The noise, in this case shows as random variations in the dark level of different photosites as the number of thermally generated electrons varies with time, process, and temperature.

As described herein, the band gap of selected photodetectors in an array may be modified without affecting the other photodetectors. This changes the absorption characteristics of the silicon on a per-pixel basis. Individual photodetectors may be modified using standard silicon processing techniques.

Figure 2:
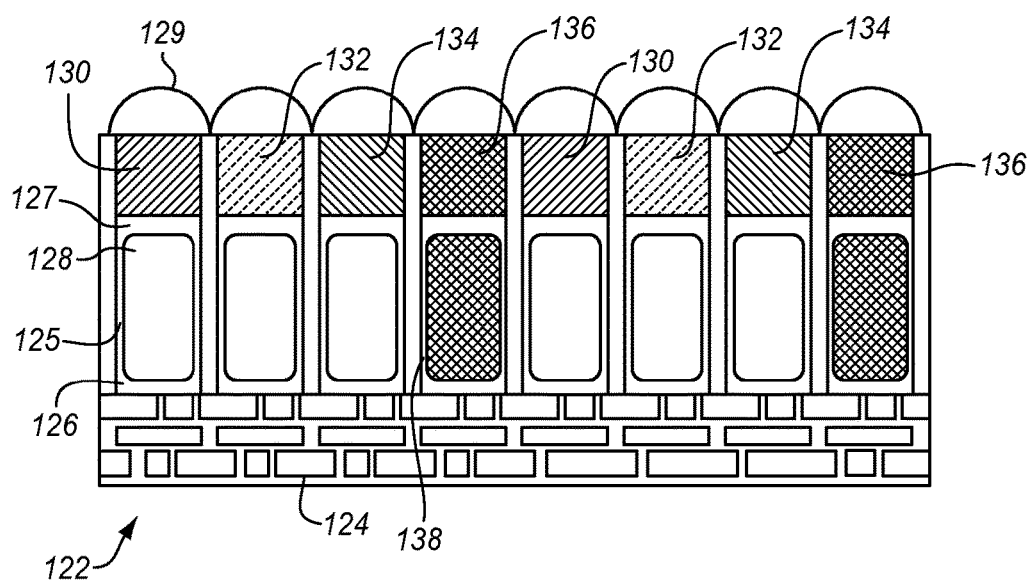
FIG. 2 is a cross-sectional side view diagram of a portion of an image sensor array with selective pixel enhancement according to an embodiment.

FIG. 2 is a cross-sectional side view diagram of a portion of a row of photodetectors of an image sensor array placed side-by-side. The pixel for each photodetector is part of a back-side illuminated array, however, embodiments are not so limited. The pixels are formed over a substrate 122 that includes wiring layers 124 for power, exposure control, and any other desired functions. Each pixel is formed in an n-well of a p-substrate 125 that is applied over the back side of the wiring layer silicon substrate 122. The n-well is the active photodiode that converts photons to electrons. A typically p+ surface passivation layer 127 is applied over the photodiodes and a color filter and a focusing lens with an anti-reflective (AR) coating is applied over the passivation layer.

Incident light strikes the AR coating and lens and penetrates through the surface passivation 127 and the p-substrate 125 to the n-well 128. The photons of the incident light are then converted to free electrons which can be measured in the circuitry of the wiring layers on the front side of the substrate 122. The image sensor is made by flipping over the substrate after the circuitry is formed on the front side of the substrate. The photodetectors 129 are built on the backside of the silicon substrate 122. An optical barrier layer 126 is formed over the back side of the substrate and then the photodetectors 128 are formed over the barrier layer. A color filter is formed over each photodetector and additional optics, e.g. a condensing, collimating, or focusing lens 129 is formed over the color filter.

In this example, the row has a repeating pattern of red 130, green 132, blue 134, and infrared 136 color filters. This pattern repeats on each row. Image sensor arrays typically have some other more complex pattern instead of the even distribution of RGB, and IR as shown. One such pattern is a Bayer pattern with twice as many green color filters as red or blue. This pattern exploits the increased sensitivity to green in human perception. The resulting image often seems more detailed to a human eye than an image from an RGB array with the same number of pixels.

The color filters limit the light that is transmitted through the filter to the respective color. For the red filter, red light passes through the filter. Other light, such as green, blue, and infrared is reflected or absorbed. For red, green, and blue light, the standard absorption characteristics of silicon will serve well as photodetectors. These photodetectors 128 are made in a conventional way and have a standard silicon bandgap.

The infrared photodetector 138, that is the photodetector under the infrared color filter, may be modified so that it responds better to infrared light. If this modification reduces its response to visible light, the performance of the array will not be reduced because the infrared filter will block any visible light from ever impinging on the photodetector area.

As shown in FIG. 2, red, green, blue and IR pass filters, 130, 132, 134, 136 are laid on top of silicon based photodiodes 128 as in traditional multi-spectral imagers. The difference in this case is that the photodiodes 138 under the NIR pass filters are processed to reduce the effective band gap of the silicon. This increases the absorption of the photodetector for NIR and also increases the leakage from thermally generated electrons. The total leakage may be reduced by only treating the NIR photodetectors and not the other three types. Such an increase in leakage would be detrimental to the accuracy of the RGB pixels, so the RGB pixels are not processed and have the standard silicon band gap and leakage characteristics. In the examples herein, the treating may be in the form of doping the IR photodetectors with chalcogens, in the form of irradiating the IR photodetectors, or in any other desired form.

For the doping approach, the original silicon bad gap energy is 1.14 eV. This can be reduced to about 1.12 eV using doping. This reduced bandgap can be obtained by hyper doping the silicon n-well with chalcogens, e.g. sulfur, selenium, or tellurium, beyond the equilibrium solubility limit. The hyper doped silicon exhibits sub-band gap light absorption, making it a suitable material for silicon based infrared (IR) detection. The doping can be controlled so that only the IR pixel 138 receives the chalcogen doping using photolithography or other silicon processing technologies.

For irradiation, laser irradiation may be applied selectively to only the NIR subpixel surfaces. This is done either in the presence of appropriate background gases that contain chalcogens or after depositing a chalcogen layer as a powder or film over the surface of the silicon. When the silicon is irradiated it forms an energy band of impurity states that overlap with the silicon conduction band edge. This band of impurities reduces the band gap from 1.1 eV to approximately 0.4 eV.

Chalcogens have a low solid solubility limit in silicon. This may be overcome by applying femtosecond or nanosecond laser annealing to chalcogen implanted silicon or to bare silicon in certain background gases. Alternatively, rapid thermal annealing may be used. The laser energy density causes a liquid phase on the silicon surface during the pulse and then a fast recrystallization velocity in between pulses. This causes some of the chalcogens to be trapped in the silicon matrix. However, this method encounters the problem of surface segregation.

These techniques are able to infuse the chalcogen impurities into the silicon. The impurities transform the silicon photodetector to have a near-unity broadband absorption below the Si bandgap, a higher generation of photocurrent below the bandgap, and an insulator-to-metal transition.

Figure 3:
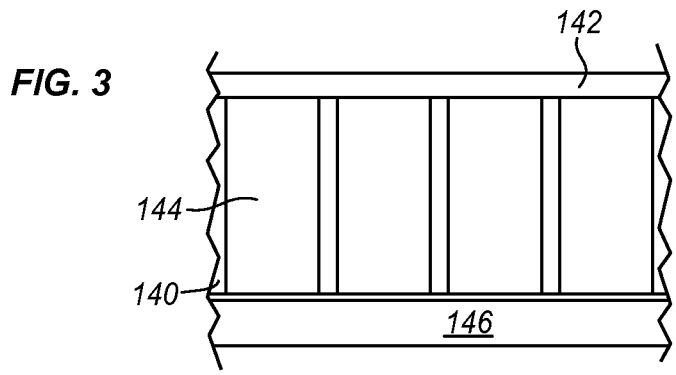
FIG. 3 is a cross-sectional side view diagram of a portion of an image sensor array with uniform pixels according to an embodiment.

FIGS. 3-6 are cross-sectional side view diagrams of a portion of an image array to show a process for forming a photodetector array such as that shown in FIG. 2. FIG. 3 has a silicon substrate 140 with photodetector n-wells 144 formed in the substrate. The n-wells are formed over a base substrate 146 which may have wiring layers and other electrical components formed therein.

A hard mask 142 of e.g. $Si_3N_4$ or $SiO_2$ is formed or deposited over each of the photodetectors. Instead of a hard mask any other protective covering or material may be used that has a low diffusivity of Sulfur. The mask 142 may be deposited or applied in any of a variety of different ways including PECVD (Plasma Enhanced Chemical Vapor Deposition) or ALD (Atomic Layer Deposition). A safe temperature for silicon may be used, such as <500° C.

In this example, the hard mask is directly on top of the pixels. Four pixels are shown to indicate red, green, blue and NIR subpixels. The pattern and arrangement may be different from that shown and a typical array will have millions of sub-pixels, although the invention is not so limited.

Figure 4:
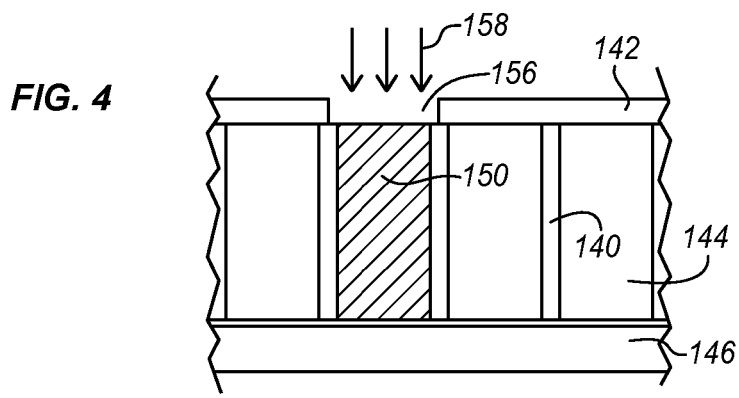
FIG. 4 is a cross-sectional side view diagram of a portion of the image sensor array of FIG. 3 with a hard mask opened for selective pixel enhancement according to an embodiment.

FIG. 4 is a similar cross-sectional side view of the same portion of the substrate 140 and hard mask 142. At this stage, the mask is etched away over the NIR pixels 150 to form an opening 156. The mask may be etched in any of a variety of different ways, for example, a sub micrometer scale lithography technology or method may be used to selectively etch away the mask layer from over the NIR subpixel area. As shown the visible light pixels 144 are not affected. The mask is only removed over the NIR pixels.

With the NIR pixels exposed, impurities 158 are driven into only the NIR pixels 150 in order to increase the sensitivity of those pixels to NIR light. The physical and electrical characteristics of the NIR pixels 150 are changed in comparison to those of the visible light pixels 144. This may be done in a variety of different ways as mentioned above. These ways include hyperdoping, laser irradiation and other techniques.

In one example, a UV (Ultraviolet) light laser, e.g. at 200 nm-300 nm wavelength, is used to irradiate the entire structure with the selective hard mask openings 156. The UV laser is applied in an ambient of $SF_6$ or $H_2S$ gases to selectively incorporate a large amount (e.g. 0.3-1 atomic percentage) of sulfur into the silicon only in the NIR subpixel area. Tellurium or selenium may be incorporated using $H_2Te$ or $H_2Se$ gases, respectively. Other chalcogens and other impurities may alternatively be used.

In another example a layer of powder or film containing chalcogens is applied over the hard mask so that the film is over the silicon of the NIR pixels but not over the silicon of the visible light pixels. These pixels are protected by the hard mask. The same UV laser treatment is applied with the film instead of with the gases to incorporate the chalcogens in the film into the silicon of the NIR pixels.

Figure 5:
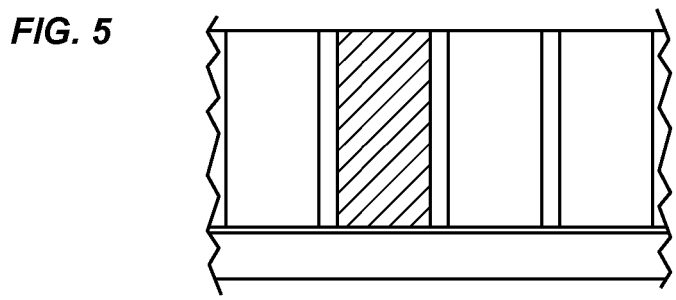
FIG. 5 is a cross-sectional side view diagram of a portion of the image sensor array of FIG. 4 with the hard mask removed according to an embodiment.

FIG. 5 is a similar cross-sectional side view of the same portion of the image sensor array after the mask has been removed. The mask may be removed using an appropriate wet or dry etching method, depending on the nature of the mask. As a result the impurities are only in the NIR pixel and the other pixels are not changed through this selective process of treating only the NIR pixels.

Figure 6:
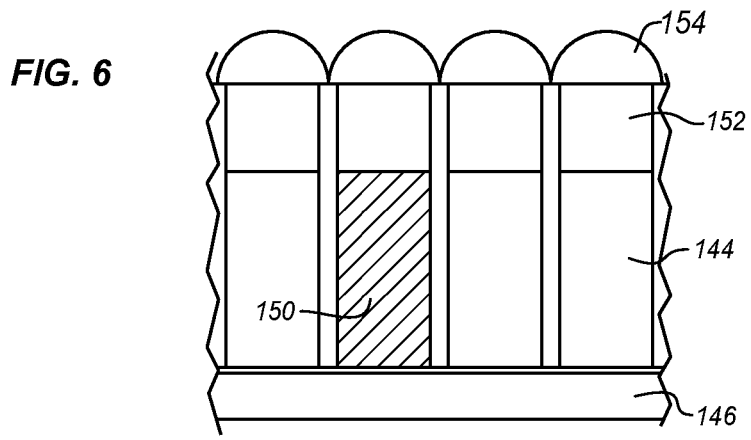
FIG. 6 is a cross-sectional side view diagram of a portion of the image sensor array of FIG. 5 with selective pixel enhancement after finishing according to an embodiment.

FIG. 6 is a similar cross-sectional side view of the same array. The processing is continued to finish the image sensors including depositing color filters 152, forming micro lenses 154, applying coatings, barriers, diffusions, etc.

Figure 7:
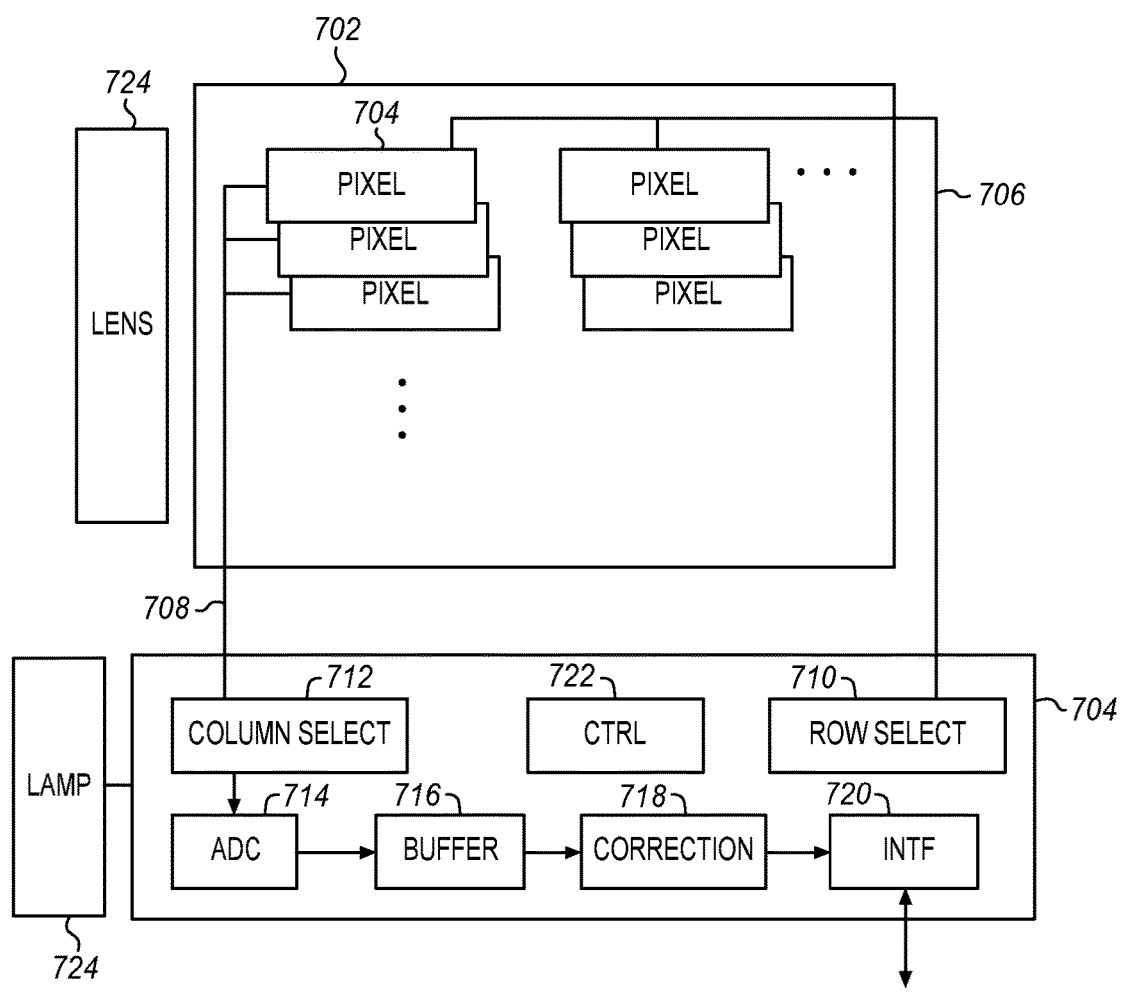
FIG. 7 is a block diagram of an image sensor with multiple photodetectors and depth sensing according to an embodiment.

FIG. 7 is a block diagram of an image sensor or camera system 700 that may include pixel circuits with infrared light enhancement properties as described herein. The camera 700 includes an image sensor 702 with pixels typically arranged in rows and columns. Each pixel may have a micro-lens and tuned bandgap photodetectors as described above. Each pixel is coupled to a row line 706 and a column line 708. These are applied to the image processor 704.

The image processor has a row selector 710 and a column selector 712. The voltage on the column line is fed to an ADC (Analog to Digital Converter) 714 which may include sample and hold circuits and other types of buffers. Alternatively, multiple ADC's may be connected to column lines in any ratio optimizing ADC speed and die area. The ADC values are fed to a buffer 716, which holds the values for each exposure to apply to a correction processor 718. This processor may compensate for any artifacts or design constraints of the image sensor or any other aspect of the system. The complete image is then compiled and rendered and may be sent to an interface 720 for transfer to external components.

The image processor 704 may be regulated by a controller 722 and contain many other sensors and components. It may perform many more operations than those mentioned or another processor may be coupled to the camera or to multiple cameras for additional processing. The controller may also be coupled to a lens system 724. The lens system serves to focus a scene onto the sensor and the controller may adjust focus distance, focal length, aperture and any other settings of the lens system, depending on the particular implementation. For stereo depth imaging, a second lens 724 and image sensor 702 may be used. This may be coupled to the same image processor 704 or to its own second image processor depending on the particular implementation.

The controller may also be coupled to a lamp or projector 724. This may be an LED in the visible or infrared range, a Xenon flash, or another illumination source, depending on the particular application for which the lamp is being used. The controller coordinates the lamp with the exposure times to achieve different exposure levels described above and for other purposes. The lamp may produce a structured, coded, or plain illumination field. There may be multiple lamps to produce different illuminations in different fields of view.

Figure 8:
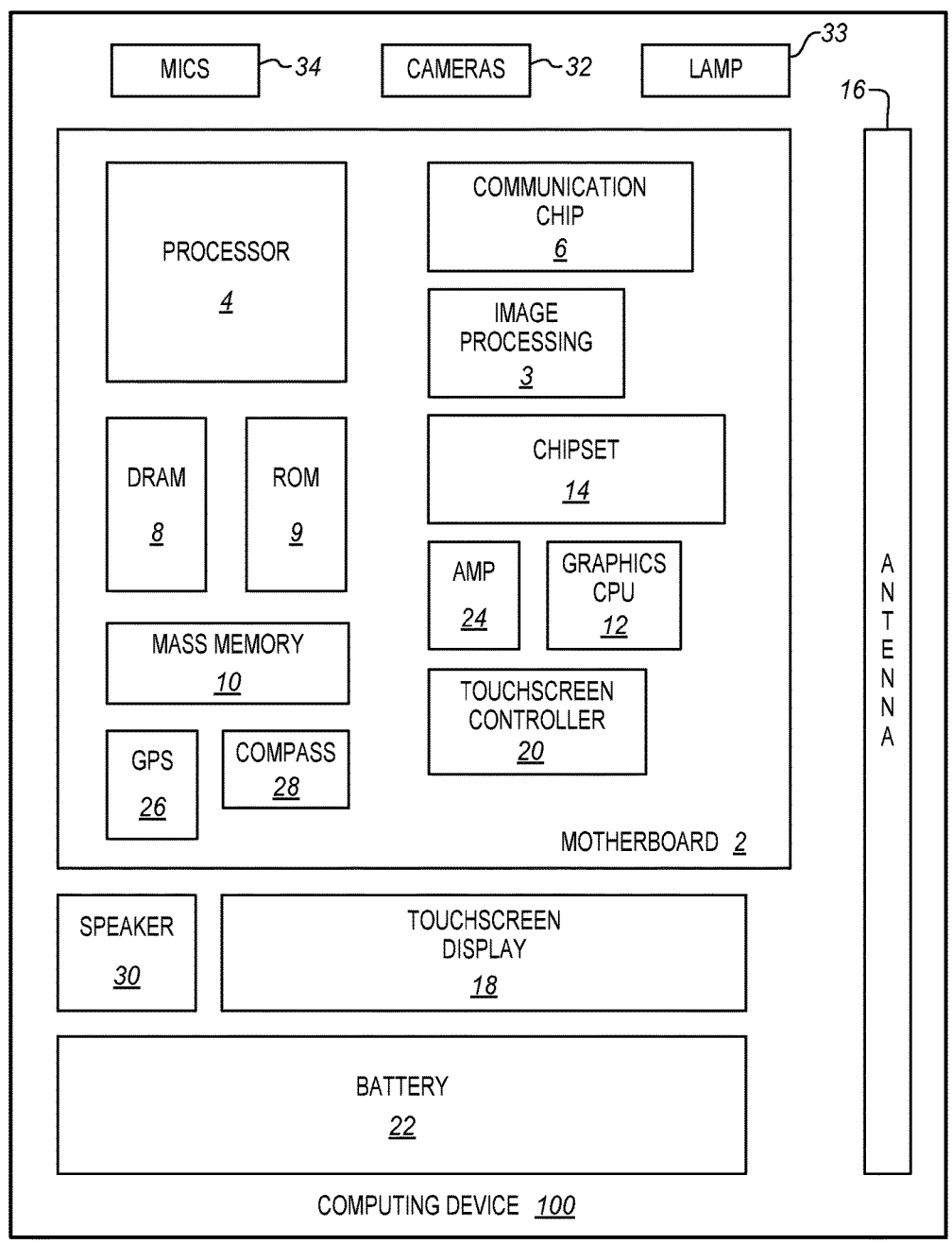
FIG. 8 is a block diagram of a computing device incorporating depth sensing and high dynamic range according to an embodiment.

FIG. 8 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, a lamp 33, a microphone array 34, and a mass storage device (such as a hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The cameras 32 contain image sensors with pixels or photodetectors as described herein. The image sensors may use the resources of an image processing chip 3 to read values and also to perform exposure control, depth map determination, format conversion, coding and decoding, noise reduction and 3D mapping, etc. The processor 4 is coupled to the image processing chip to drive the processes, set parameters, etc.

In various implementations, the computing device 100 may be eyewear, a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, a digital video recorder, wearables or drones. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method of forming an image sensor that includes forming an array of photodetectors on a silicon substrate, treating a subset of the photodetectors to improve sensitivity to infrared light, and finishing the photodetector array to form an image sensor.

In further embodiments forming an array comprises forming an array on the back side of the substrate after forming circuitry on the front side of the substrate.

In further embodiments treating comprises doping the subset of the photodetectors with at least one of sulfur, selenium, and tellurium.

In further embodiments doping comprises forming a mask over the photodetectors that are not of the subset, applying a chemical vapor deposition of chalcogens over the photodetectors that are not masked and applying a thermal anneal to the photodetectors that are not masked.

In further embodiments treating comprises irradiating the subset of the photodetectors.

In further embodiments irradiating comprises irradiating in the presence of chalcogens to drive chalcogen impurities into the subset of photodetectors.

In further embodiments treating comprises causing a silicon surface of the subset of photodetectors to transition to liquid in the presence of chalcogens and then to rapidly solidify with some chalcogen incorporated.

In further embodiments applying visible light color filters comprises applying a red, a green, or a blue color filter over each photodetector that is not treated in a repeating pattern.

Further embodiments include applying infrared light color filters over the treated photodetectors, and applying visible light color filters over the photodetectors that are not treated Some embodiments pertain to an image sensor that includes a silicon substrate, a first set of photodetectors on the silicon substrate that have impurities that improve sensitivity to infrared light, a second set of photodetector on the silicon substrate, that do not have the impurities, and an optical system to direct visible and infrared light to the first and the second sets of photodetectors.

In further embodiments the impurities comprise at least one of sulfur, selenium, and tellurium.

In further embodiments the impurities are trapped in the silicon matrix of photodetectors of the first array of photodetectors.

In further embodiments the array is formed on a back side of the silicon substrate.

Further embodiments include circuit layers on a front side of the silicon substrate opposite the circuit layers.

Further embodiments include a plurality of infrared light color filters one over each photodetector of the first set of photodetectors and a plurality of visible light color filters one over each photodetector of the second set of photodetectors.

In further embodiments the visible light color filters are in a repeating pattern over the array.

Some embodiments pertain to a portable computing system that includes a processor, a communications chip coupled to the processor to send and receive images, and an image sensor coupled to the processor having a silicon substrate, a first set of photodetectors on the silicon substrate that have impurities that improve sensitivity to infrared light a second set of photodetector on the silicon substrate, that do not have the impurities, and an optical system to direct visible and infrared light to the first and the second sets of photodetectors.

In further embodiments the first set of photodetectors is doped with the impurities.

In further embodiments the first set of photodetectors has a reduced effective silicon band gap as compared to the second set of photodetectors.

In further embodiments the first set of photodetectors is distributed across the sensor in a repeating pattern with the second set of photodetectors.

What is claimed is:

1. An image sensor comprising:
   a silicon substrate;
   a first set of photodetectors on the silicon substrate that have impurities that improve sensitivity to infrared light;
   a second set of photodetector on the silicon substrate, that do not have the impurities; and
   an optical system to direct visible and infrared light to the first and the second sets of photodetectors.

2. The image sensor of claim 1, wherein the impurities comprise at least one of sulfur, selenium, and tellurium.

3. The image sensor of claim 1, wherein the impurities are trapped in the silicon matrix of photodetectors of the first array of photodetectors.

4. The image sensor of claim 1, wherein the array is formed on a back side of the silicon substrate.

5. The image sensor of claim 4, further comprising circuit layers on a front side of the silicon substrate opposite the circuit layers.

6. The image sensor of claim 1, further comprising:
   a plurality of infrared light color filters one over each photodetector of the first set of photodetectors; and
   a plurality of visible light color filters one over each photodetector of the second set of photodetectors.

7. The image sensor of claim 6, wherein the visible light color filters are in a repeating pattern over the array.

8. A portable computing system comprising:
   a processor;
   a communications chip coupled to the processor to send and receive images; and
   an image sensor coupled to the processor having a silicon substrate, a first set of photodetectors on the silicon substrate that have impurities that improve sensitivity to infrared light a second set of photodetector on the silicon substrate, that do not have the impurities, and an optical system to direct visible and infrared light to the first and the second sets of photodetectors.

9. The system of claim 8, wherein the first set of photodetectors is doped with the impurities.

10. The system of claim 8, wherein the first set of photodetectors has a reduced effective silicon band gap as compared to the second set of photodetectors.

11. The system of claim 8, wherein the first set of photodetectors is distributed across the sensor in a repeating pattern with the second set of photodetectors.

* * * * *